(12) United States Patent
Seitz

(10) Patent No.: US 6,947,863 B2
(45) Date of Patent: Sep. 20, 2005

(54) PROCESS AND CIRCUIT ARRANGEMENT TO MONITOR PHYSICAL PARAMETERS

(75) Inventor: Hans-Juergen Seitz, Berg (DE)

(73) Assignee: Siemens Aktiengesellschaft, Munich (DE)

(*) Notice: Subject to any disclaimer, the term of this patent is extended or adjusted under 35 U.S.C. 154(b) by 473 days.

(21) Appl. No.: 10/238,883

(22) Filed: Sep. 11, 2002

(65) Prior Publication Data

US 2003/0135345 A1 Jul. 17, 2003

(30) Foreign Application Priority Data

Jan. 14, 2002 (EP) .............................. 02000813

(51) Int. Cl.[7] .......................... G06F 19/00; H02H 3/04
(52) U.S. Cl. ..................... 702/117; 375/368; 370/442; 324/537
(58) Field of Search ................................ 702/117, 118; 324/537; 370/442, 515; 375/340, 368

(56) References Cited

U.S. PATENT DOCUMENTS 5,579,321 A * 11/1996 Van Grinsven et al. ..... 370/442
6,026,130 A *  2/2000 Rahmatullah et al. ...... 375/340

FOREIGN PATENT DOCUMENTS

| DE | 41 27 392 A1 | 2/1993 |
| DE | 199 06 932 A1 | 8/2000 |
| EP | 0 283 895 A1 | 9/1988 |
| EP | 0 419 943 A2 | 4/1991 |

OTHER PUBLICATIONS

"A Compact board–mounted power supply module for telecommunications systems"; Murakami, N. et al; IEEE, 10th Int. Telecom. Energy Conference; Oct. 30–Nov. 2, 1988.*

* cited by examiner

Primary Examiner—Kamini Shah
(74) Attorney, Agent, or Firm—Morrison & Foerster LLP

(57) ABSTRACT

Monitoring is performed by at least two independent monitoring modules whose signals are linked through linking means. This makes it possible to test the two independent monitoring modules independent of one another.

17 Claims, 2 Drawing Sheets

PROCESS AND CIRCUIT ARRANGEMENT TO MONITOR PHYSICAL PARAMETERS

CLAIM FOR PRIORITY

This application claims priority to Europe Application No. 02000813.2 which was filed in the German language on Jan. 14, 2002.

TECHNICAL FIELD OF THE INVENTION

This invention pertains to a circuit arrangement and process to monitor physical parameters as well as a process to diagnose the circuit arrangement according to the invention, in particular for use in telecommunications equipment.

BACKGROUND OF THE INVENTION

In digital assemblies, the power supply voltage is monitored through a voltage monitoring module. If the deviation of the power supply voltage from its setpoint reaches or exceeds a specified threshold value, the voltage monitoring module triggers a reset of the entire digital assembly, called a ""Power-On Reset"" below, so as to prevent any undefined logic states. Likewise, the entire digital assembly is provided with a Power-On Reset signal during the time the power supply voltage is turned on, which has the effect of keeping the digital assembly from transitioning to its operating state before a defined time or before the power supply voltage reaches a stable state.

For systems on whose fail-safeness certain minimum requirements are placed, it is common to perform a diagnosis or self-test at regular intervals and/or at the user's request during operation by built-in or external mechanisms. This is called ""On-Line Diagnosis"" in general. It is also desirable to incorporate the voltage monitoring module into this online diagnosis since it is precisely these modules that have a relatively high error probability, i.e., voltage monitoring modules have a relatively high FIT rate—Failure in Time Rate—(failure rate).

If as part of an online diagnosis, the voltage monitoring module is to be tested for-correct functionality, i.e., by issuing a signal for this purpose to an appropriate signal input of the voltage monitoring module, a fluctuation in the power supply voltage is simulated, whereupon the voltage monitoring module produces an active Power-On Reset signal, this Power-On Reset signal likewise results in resetting the entire logic of an assembly as well as the processors contained therein. One of these processors will normally initiate the voltage monitoring test as one test step in the overall diagnosis procedure. However, since this test triggers the same Power-On Reset as is triggered when the device is turned on or during a strong fluctuation in the power supply voltage, it is very difficult for the processor to differentiate whether the assembly has just been turned on, a ""true"" Power-On Reset, or whether a test of the voltage monitoring module, a ""simulated"" Power-On Reset, was responsible for the Power-On Reset.

Furthermore, the assembly initialization procedure directly follows a Power-On Reset. This initialization procedure or boot-up of the assembly after a Power-On Reset requires a not insignificant time frame, for example if large memory areas must be formatted or if large amounts of data are loaded from slow, non-volatile memories to the working memory.

Known solutions to this problem make use of a memory register, for example a static RAM memory, that is not erased by a pure Reset without an interruption in voltage, so as to differentiate between a ""true"" and a ""simulated"" Power-On Reset. This register is read after every Power-On Reset. There are three different cases:

- The ""test data template"" exists in the memory register. This is the index for a ""simulated"" Power-On Reset as part of an online diagnosis that is continued at this point.
- The ""operating data template"" exists in the memory register. This is the index for a ""true"" Reset that, for example, had been triggered by the voltage monitoring module due to a voltage fluctuation or by an assembly Reset.
- Neither the ""test data template"" nor the ""operating data template"" exists in the memory register. This is the index for a ""true"" Power-On Reset after the power supply voltage is turned on. The processor now writes the ""operating data template"" to the register immediately and a normal assembly boot-up follows.

However, the differentiation of these three cases is not clear-cut all the time, due to physical effects, for example. For example, it has not been established how long a static RAM memory can maintain a data template without an operating voltage. Thus, it is possible that the memory register can still contain the ""operating data template"" even though the assembly had been shut off for a longer period of time, in some cases for many minutes. Also, cases in which the ""test data template"" has just been written into the memory register and the Reset is triggered not by the test signal, but by a random voltage fluctuation, cannot be differentiated from cases in which the Reset is triggered by the test signal.

SUMMARY OF THE INVENTION

It is an aspect of the invention to improve the known processes and circuit arrangements to monitor physical parameters.

According to an aspect of the invention, a circuit arrangement is provided that encompasses a first monitoring module RG1 to monitor at least one physical parameter U1, U2 which can feed a signal to an evaluation circuit A when the monitored physical parameter U1, U2 deviates from its prescribed setpoint range, using a first output signal carrying means PON-RES1_L_I and with a first input signal carrying means PON-TEST1_L_O to input a first test signal. The first test signal can produce the same change in state of the first monitoring module RG1 as is produced by a deviation of the monitored physical parameter from its setpoint range. At least one other monitoring module RG2 to monitor the same physical parameter U1, U2 is provided, which can feed a signal to the evaluation circuit A when the monitored physical parameter U1, U2 deviates from its prescribed setpoint range using other output signal carrying means PON-RES2_L_I and with other input signal carrying means PON-TEST2_L_O to input another test signal. The other test signal can produce the same change in state of the other monitoring module RG2 as is produced by a deviation of the monitored physical parameter from its setpoint range.

A linking means V1 associated with the evaluation circuit A to link the signals fed through the first output signal carrying means PON_RES1_L_I and the other output signal carrying means PON_RES2_L_I to a resultant output signal PON_RES is also provided. A first register means RTR is associated with the evaluation circuit A to separately impress the first test signal onto the first input"

signal carrying means PON_TEST1_L_O and the second test signal onto the other input signal carrying means PON_TEST2_L_O. The first register means RTR can receive control information SI from control means S. A second register means RIR is associated with the evaluation circuit A that is connected to the first output signal carrying means PON_RES1_L_I and the other output signal carrying means PON_RES2_L_I and can transfer status information ZI to the control means S. The control means S is associated with the evaluation circuit A, which encompass a means to evaluate status information ZI of the second register means RIR and a means to send control information SI to the first register means RTR.

An important advantage to this improved circuit arrangement is seen in that the monitoring is done by at least two independent monitoring modules RG1, RG2, so that by suitably selecting the linking means V1 of the evaluation circuit A, improved results can be attained in comparison with a circuit arrangement with only one monitoring module. In particular, it is possible to test the at least two independent monitoring modules RG1, RG2 independent of one another. This has a significant advantage in comparison to known solutions, in that the monitoring modules RG1, RG2, can be tested without having to trigger a Reset of the entire digital assembly, inclusive of the test logic or diagnostic logic.

To this end, it is advantageous that the signals of the monitoring modules are linked by means of a logical AND function. This provides that only a state that is simultaneously established by the at least two monitoring modules RG1, RG2 can produce a valid Reset signal PON-RES for the digital assembly. However, an individual Reset signal by one of the monitoring modules as part of a test of this module does not trigger a Reset of the entire digital assembly.

In order to ensure the reliability of the evaluation circuit A and to detect failures, the evaluation circuit is incorporated into the self-test or diagnosis strategy of the superordinate unit. In particular, for application-specific integrated circuits, or so-called ASIC's, processes and circuit implementations already exist in the form of built-in self tests that can be applied in a simple manner to the evaluation circuit A or sections of the evaluation circuit A.

According to an aspect of the invention, the circuit arrangement is suited advantageously for the monitoring of all physical parameters for which a Reset is required if a setpoint range is exceeded, for example for safety reasons or to prevent damage to the assembly, as well as to test the respective monitoring modules.

According to another aspect of the invention, for electronic assemblies, it is especially important to monitor electrical voltages, currents and temperatures. In the case of monitoring electrical voltages, this can prevent undefined logic states. If electrical currents and/or temperatures are monitored, damage caused by dissipation rates that are too high can be prevented by interrupting the current operation.

In electronic logic assemblies, there are usually two electrical voltages U1 and U2 powering the logic modules. According to an aspect of the invention, each of these two voltages is monitored by two monitoring modules.

For clocked electronic logic assemblies that operate with high clock frequencies, it is required that stable clock states be attained before activating the logic circuitry. According to an aspect of the invention, Reset signals with their own individual time characteristics are provided through different output signal carrying means, making a delayed removal of the Reset signal for the logic circuitry compared with the removal of the Reset signal for the clock-generating circuit sections possible.

According to a further aspect of the invention, testing of the monitoring modules RG1, RG2 is carried out by a method in which the first monitoring module RG1 is selected by the control means S, control information SI representing this selection is then transferred to the first register means RTR. A test signal is then transferred to the first monitoring module RG1 by means of the first input signal carrying means PON_TEST1_L_O. The status information ZI produced by the second register means RIR, which represents the signals of the output signal carrying means PON_RES1_L_I, PON_RES2_L_I, are received and then checked to see that the signal of the first output signal carrying means PON_RES1_L_I is a valid Reset signal and that the signal of the other output signal carrying means PON_RES2_L_I is an arbitrary valid signal different from the Reset signal. After a prescribed time frame beginning with the establishment of a valid Reset signal, a check is performed by the control means S to see that the signal of the first output signal carrying means PON_RES1_L_I returns to an arbitrary valid signal different from the Reset signal. This method is repeated for all other monitoring modules RG2 accordingly.

This process helps to make advantageous use of the circuit arrangement according to the invention to test the at least two independent monitoring modules RG1, RG2 independent of one another. This provides a significant advantage in comparison to known solutions in that the monitoring modules RG1, RG2 can be tested without having to trigger a Reset of the entire digital assembly inclusive of the test logic or diagnostic logic.

DETAILED DESCRIPTION OF THE INVENTION

Figure 1:
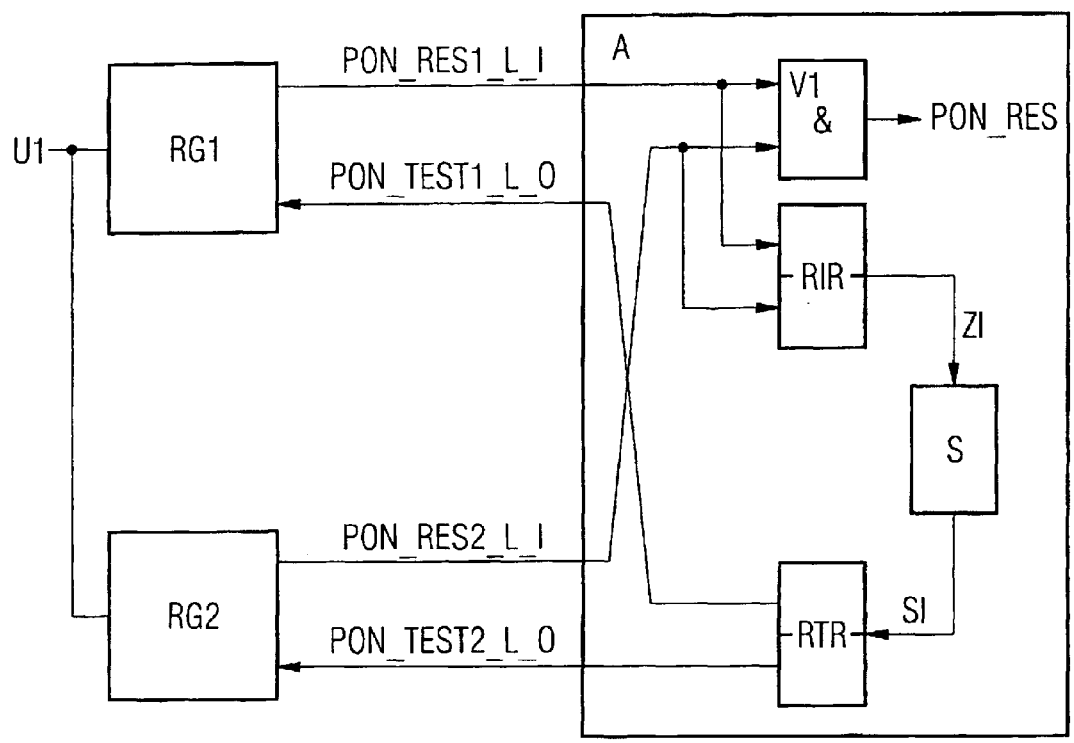
FIG. 1 is a schematic representation of the circuit arrangement according to an aspect of the invention to monitor a physical parameter such as an electrical voltage.

FIG. 1 shows an electrical voltage U1, which is monitored by a first Power-On Reset generator RG1 (called voltage monitoring module RG1 below) and a second Power-On Reset generator RG2 (called voltage monitoring module RG2 below). When the voltage U1 deviates from a prescribed setpoint range, for example a nominal value of 5 volts with an allowable deviation of ±5% of the nominal value, the first voltage monitoring module RG1 produces a Reset signal on a first Reset line PON_RES1_L_I (Power-On_Reset1_Low-active_Input) that is an output line of the first voltage monitoring module RG1, and the second voltage monitoring module RG2 produces a Reset signal on a second Reset line PON_RES2_L_I (Power-On Reset2_Low-active_Input) that is an output line of the second voltage monitoring module RG2.

The first voltage monitoring module RG1 has an input line PON_TEST1_L_O (Power-On_Test1_Low-active_Output), through which a first test signal can be input to the first voltage monitoring module RG1. Inputting the first test signal to the first voltage monitoring module RG1 causes the voltage monitoring module RG1 to perform a self-test, from which a valid Reset signal is issued on the first Reset line PON_RES1_L_I.

The second voltage monitoring module RG2 has an input line PON_TEST2_L_O (Power-On_Test2_Low-active_Output), through which a second test signal can be input to the second voltage monitoring module RG2. Inputting the second test signal to the second voltage monitoring module RG2 causes the voltage monitoring module RG2 to perform a self-test, from which a valid Reset signal is issued on the second Reset line PON_RES2_L_I.

In normal operating condition, i.e., the monitored voltage U1 lies within the prescribed setpoint range and no test signals are input through the input lines PON_TEST1_L_O, PON_TEST2_L_O to the voltage monitoring modules RG1, RG2, the outputs on the Reset lines PON_RES1_L_I, PON_RES2_L_I are signals that are different from a Reset signal. A common form of a signal different from a Reset signal on a Reset line is a steady high level representing the logic state "1", whereas an active Reset signal is a low level representing the logic state "0". This characteristic of a signal line is also called "low active". The circuit arrangement according to the invention is, however, easily applicable to other signal forms on the Reset lines PON_RES1_L_I, PON-RES2_L_I.

The signals of the Reset lines PON_RES1_L_I, PON-RES2_L_I are input signals to an evaluation circuit A, whereas the signals of input lines PON_TEST1_L_O, PON-TEST2_L_O to the voltage monitoring-modules RG1, RG2 are output signals from the evaluation circuit A.

The evaluation circuit A encompasses at least four elements according to the invention, wherein these four elements can be assembled in arbitrary combinations. These four elements are, individually a linking circuit V1 that has as its input signal the signals of the first Reset line PON_RES1_L_I and the second Reset line PON_RES2_L_I, and as its output signal a Reset signal PON_RES resulting therefrom and generated using a logical AND function, a Reset Index Register RIR that stores the signals of the first Reset line PON_RES1_L_I and the second Reset-line PON_RES2_L_I temporarily, having an appropriate amount of memory for this purpose, a Reset Test Register RTR that impresses separate signals onto the input lines PON_TEST1_L_O, PON_TEST2_L_O of the voltage monitoring modules RG1, RG2, a control unit S that sends control information SI to the Reset Index Register RIR, reads out status information from the Reset Index Register RIR and controls the diagnosis of the voltage monitoring modules RG1, RG2.

The evaluation circuit A can, according to the invention, be a component of an assembly (not shown). According to an advantageous further development of the circuit arrangement of the invention, the evaluation circuit A is then incorporated into the diagnosis of the assembly. The control unit S then simultaneously controls, for example, other diagnostic control units that control the diagnosis of other functional units of the assembly, or the control unit S is controlled through a central control unit (not shown).

The evaluation circuit can be a component of a modern, application-specific integrated circuit (ASIC) which is not shown. In order to ensure the reliability of the evaluation circuit A, and of the linking circuit V1 in particular, thus ensuring the high level of availability of the entire system, the evaluation circuit A is then completely or partially incorporated into the built-in self test process, BIST of the ASIC, well known in the art (not shown).

The process according to the invention to monitor the voltage U1 proceeds in the control unit S in the steps already described above.

Figure 2:
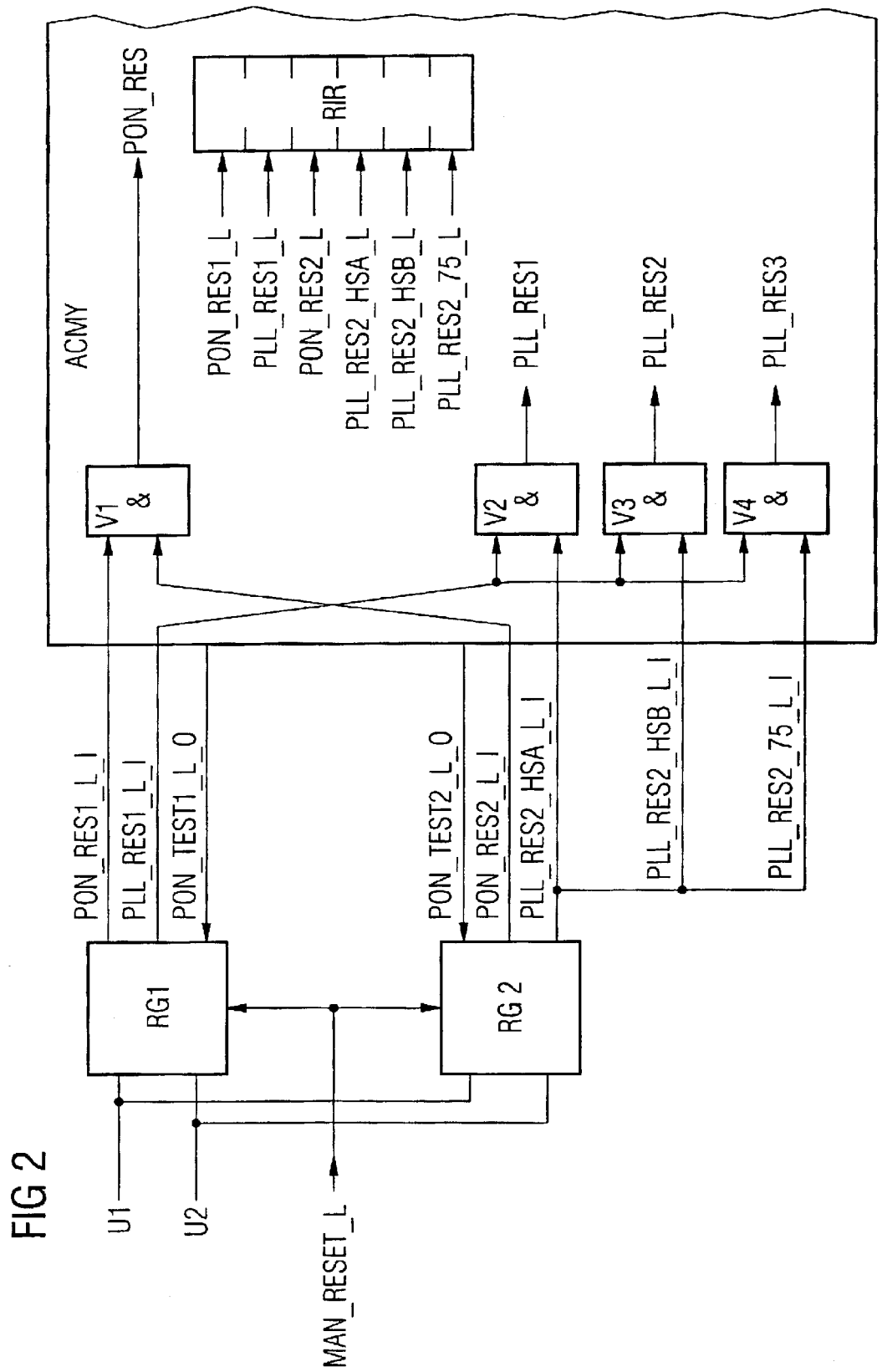
FIG. 2 is a schematic representation of an application of the circuit arrangement according to another aspect of the invention to monitor two electrical voltages U1, U2.

With reference to FIG. 2, an application of the principles explained in connection with FIG. 1 of the present invention is illustrated for a memory assembly of a processor in a voice switching system.

FIG. 2 shows a first voltage U1 to be monitored and a second voltage U2 to be monitored, both of which are monitored by the first voltage monitoring module RG1 and the second voltage monitoring module RG2. In typical logic modules, the first voltage U1 can thus be monitored at a nominal value of 2.5 volts, the second voltage U2 can be monitored at a nominal value of 3.3 volts, and each of these with its respective first and second setpoint range.

Instead of only one Reset line each, the two voltage monitoring modules RG1, RG2 have two Reset lines each. If the first voltage U1 deviates from its respective first setpoint range, or if the second voltage U2 deviates from its respective second setpoint range, as well as when the power supply voltage is turned on, the first voltage monitoring module RG1 produces a Reset signal on the first Reset line PON_RES1_L_I and on a third Reset line PLL_RES1_L_I (PLL_Reset1_Low-active_Input), both of which are output lines of the first voltage monitoring module RG1. In the same manner, if the first voltage U1 deviates from its respective first setpoint range, or if the second voltage U2 deviates from its respective second setpoint range, the second voltage monitoring module RG2 produces a Reset signal on the second Reset line PON_RES2_L_I and on another Reset line that feeds signals to a total of three Reset lines: a fourth Reset line PLL_RES2_HSA_L_I (PLL_Reset2_HighSpeedClockDomainA_Low-active_Input), a fifth Reset line PLL_RES2_HSB_L_I (PLL_Reset2_HighSpeedClockDomainB_Low-active_Input), and a sixth Reset line PLL_RES2_75_L_I (PLL_Reset2_75MHzClockDomain_Low-active_Input).

Due to circuit considerations, this exemplary embodiment requires the Reset signals to be split into a total of six Reset lines, as explained below. An ACMY (ASIC for Common Memory) module, for which the voltage monitoring and the generation of Power-On Reset signals is performed, is a highly complex ASIC that has, among other things, three different clock domains controlled by three separate phase control loops, PLL (phase locked loop), which are not shown. The Reset signals for these PLL's are provided through the third Reset line PLL_RES1_L_I, the fourth Reset line PLL_RES2_HSA_L_I, the fifth Reset line PLL_RES2 HSB_L_I, and the sixth Reset line PLL_RES2_75_L_I. The first Reset line PON_RES1_L_I and the second Reset line PON_RES2_L_I provide the Reset signals for a logic circuit clocked by the three PLL'S.

As soon as the clock states are stable, the logic circuit is switched to its operating state. In order to attain this, the logic circuit is activated later than the three PLL's by longer Reset signals on the first Reset line PON_RES1_L_I and the second Reset line PON_RES2_L_I compared to the Reset signals of the other four Reset lines.

The three PLL's are provided with different Reset signals. This provides advantages when testing the PLL since it becomes-possible this way to separately test each PLL and thus the clock domains supplied by the PLL's. Effects on the circuit arrangement according to the invention only occur to the extent that the PLL Reset signal of the second voltage monitoring module RG2 feeds a total of three Reset lines: the fourth Reset line PLL_RES2_HSA_L_I, the fifth Reset line PLL_RES2_HSB_L_I, and the sixth Reset line PLL_RES2_75_L_I.

The first voltage monitoring module RG1 contains the first input line PON_TEST1_L_O, as explained already in connection with FIG. 1, through which the first test signal is input to the first voltage monitoring module RG1. Inputting the first test signal to the first voltage monitoring module RG1 causes the voltage monitoring module RG1 to perform a self-test, whereupon a valid Reset signal is issued therefrom to both the first Reset line PON-RES1_L_I and to the second Reset line PLL_RES1_L_I.

The first voltage monitoring module RG1 also has a third input line that is connected to a central Reset line MAN_RESET_L. This central Reset line MAN_RESET_L is connected to a device to manually trigger a Reset, for example. Inputting a valid Reset signal through the third input line connected to the central Reset line to the first voltage monitoring module RG1 causes a valid Reset signal to be issued to both the first Reset line PON-RES1_L_I and to the third Reset line PLL_RESL1_L_I.

The second voltage monitoring module RG2 contains the second input line PON_TEST2_L_O, as already explained in connection with FIG. 1, through which the second test signal is input to the second voltage monitoring module RG2. Inputting the second test signal to the second voltage monitoring module RG2 causes the voltage monitoring module RG2 to perform a self-test, whereupon a valid Reset signal is issued therefrom to the second Reset line PON-RES2_L_I, the fourth Reset line PLL_RES2_HSA_L_I, the fifth Reset line PLL_RES2_HSB_L_I, and the sixth Reset line PLL_RES2_75_L_I.

The second voltage monitoring module RG2 also has a fourth input line that is connected to a central Reset line MAN_RESET_L. Inputting a valid Reset signal through the fourth input line connected to the central Reset line to the second voltage monitoring module RG2 causes a valid-Reset signal to be issued to the second Reset line PON-RES2_L_I, the fourth Reset line PLL_RES2 HSA_L_I, the fifth Reset line PLL_RES2_HSB_L_I, and the sixth Reset line PLL_RES2_75_L_I.

The six Reset lines mentioned are input lines to the ACMY ASIC, of which only the elements required for voltage monitoring and their testing are shown. The first input line PON_TEST1_L_O of the first voltage monitoring module RG1 and the second input line PON_TEST2_L_O of the second voltage monitoring module RG2 are output lines of the ACMY ASIC.

The six Reset lines are connected as follows within the ACMY ASIC to four linking elements, which then provide four resultant Reset signals. The signal from the first Reset line PON_RES1_L_I and the signal from the second Reset line PON_RES2_L_I are linked in the first linking element V1 to the first resultant Reset signal PON_RES. The signal from the third Reset line PLL_RES1_L_I and the signal from the fourth Reset line PLL_RES2_HSA_L_I are linked in a second linking element V2 to a second resultant Reset signal PLL_RES1. The signal from the third Reset line PLL_RES1_L_I and the signal from the fifth Reset line PLL_RES2_HSB_L_I are linked in a third linking element V3 to a third resultant Reset signal PLL_RES2. The signal from the third Reset line PLL_RES1_L_I and the signal from the sixth Reset line PLL_RES2_75_L_I are linked in a fourth linking element V4 to a fourth resultant Reset signal PLL_RES3.

Also, the six Reset lines are connected to the inputs of the Reset Index Register RIR within the ACMY ASIC, which has available six inputs, accordingly, and a larger number of memory locations, accordingly., than compared to FIG. 1. This is schematically represented in FIG. 2. The Reset Index Register is connected to control unit S as in FIG. 1, which is not shown in detail in FIG. 2.

The output lines from the ACMY ASIC (the first input line PON_TEST1_L_O and the second input line PON_TEST2_L_O) are connected to the Reset Test Register RTR from FIG. 1 within the ACMY ASIC (not shown). The Reset Test Register RTR is connected to control unit S (not shown).

The test procedure for the circuit arrangement according to FIG. 2 corresponds to that described for the circuit arrangement according to FIG. 1, with modifications in steps four and five. The modifications pertain to the circumstance that the circuit arrangement according to FIG. 2 has two Reset lines for the first voltage monitoring module RG1 and four Reset lines for the second voltage monitoring module RG2. Accordingly, in steps four and five of the procedure, two and four Reset lines must be taken into account which return, at the end of different time frames, to an arbitrary valid signal that is different from the Reset signal, i.e., in step five different time frames must be provided for different Reset lines of the same module.

The linking elements V1, V2, V3, and V4 used in the preferred exemplary embodiment implement the logical AND function to valid Reset signals. Since valid Reset signals can be represented by the logical state "0", for example in case of low-active signal lines, a circuit implementation must be selected that is tailored, accordingly, to the existing input signals and to the desired output signals. Procedures for designing logic circuits and circuit arrangements to implement logical functions, for example for low-active logic circuits, are well-known in the art, so that this invention can be tailored according to specific circumstances.

What is claimed is:

1. A circuit arrangement to monitor physical parameters, comprising:
   a first monitoring module to monitor at least one physical parameter with means to feed a signal to an evaluation circuit when the monitored physical parameter deviates from a prescribed setpoint range using a first output signal carrying means and with a first input signal carrying means to input a first test signal, wherein the first test signal can produce a change in state of the first monitoring module the same as is produced by a deviation of the monitored physical parameter from its setpoint range;
   at least one other monitoring module to monitor the physical parameter, with means to feed a signal to the evaluation circuit when the monitored physical parameter deviates from its prescribed setpoint range, using other output signal carrying means and with other input signal carrying means to input another test signal, wherein the other test signal can produce a change in state of the other monitoring module the same as is produced by a deviation of the monitored physical parameter from its setpoint range;
   linking means associated with the evaluation circuit to link the signals fed through the first output signal carrying means and the other output signal carrying means to a resultant output signal;
   a first register means associated with the evaluation circuit to separately impress the first test signal onto the first input signal carrying means and the second test signal onto the other input signal carrying means, wherein the first register means has a means to receive control information from a control means; and
   a second register means associated with the evaluation circuit that is connected to the first output signal carrying means and the other output signal carrying means and that includes a means to transfer status information to the control means, wherein the control means associated with the evaluation circuit, which encompass means to evaluate status information from the second register means and means to send control information to the first register means.

2. A circuit arrangement according to claim 1, wherein the logic means is a gate that implements the logical AND function.

3. A circuit arrangement according to claim 1, wherein the evaluation circuit is part of an assembly, and is a component of a diagnosis strategy of the assembly.

4. A circuit arrangement according to claim 1, wherein the evaluation circuit is a part of an application-specific integrated circuit, and the evaluation circuit is included in the integrated self-test application-specific integrated circuit.

5. A circuit arrangement according to claim 1, wherein the at least one monitored physical parameter is an arbitrary selection of physical parameters which produce a reset signal when a prescribed setpoint range is deviated from.

6. A circuit arrangement according to claim 1, wherein the at least one monitored physical parameter is one of electric voltage, electric current and temperature.

7. A circuit arrangement according to claim 1, wherein the at least one monitored physical parameter is a selection of at least two electric voltages that are each monitored by both monitoring modules.

8. A circuit arrangement according to claim 1, wherein the monitoring modules each have a number of output signal carrying means, wherein each of the signals transferred through the numerous output signal carrying means of the same monitoring module has its own time characteristics.

9. A method for monitoring at least one physical parameter, comprising:

monitoring the physical parameter by a first monitoring module, wherein a signal is supplied by the first monitoring module through a first output signal carrying means to an evaluation circuit when the monitored physical parameter deviates from its prescribed setpoint range;

inputting a first test signal to the first monitoring module through a first input signal carrying means, wherein the first test signal causes the same change in state of the first monitoring module as would be caused by a deviation of the monitored physical parameter from its setpoint range;

monitoring the physical parameter by at least one other monitoring module, wherein a signal is supplied by the other monitoring module through other output signal carrying means to the evaluation circuit when the monitored physical parameter deviates from its prescribed setpoint range;

inputting a second test signal is input to the other monitoring module through other input signal carrying means, wherein the second test signal causes a change in state of the other monitoring module the same as would be caused by a deviation of the monitored physical parameter from its setpoint range;

feeding the signals to the evaluation circuit through the first output signal carrying means and the other output signal carrying means are linked by linking means, which are a component of the evaluation circuit, to a resultant output signal;

separately impressing the first and the second test signals onto the first input signal carrying means and the other input signal carrying means by the evaluation circuit by first register means, wherein control information from the control means is evaluated by the register means;

intercepting signals from the first output signal carrying means and the other output signal carrying means and transferring status information to the control means through the evaluation circuit by the second register means; and evaluating the status information of the second register means and sending control information is sent to the first register means through the evaluation circuit by the control means.

10. A method according to claim 9, wherein testing the monitoring modules comprises:

selecting the first monitoring module is selected by the control means, transferring control information representing this selection to the first register means;

transferring the first test signal to the first monitoring module means of the first input signal carrying means;

checking the received status information produced by the second register means, which represents the signals of the output signal carrying means to see that the signal of the first output signal carrying means is a valid Reset signal and that the signal of the other output signal carrying means is an arbitrary valid signal different from the Reset signal; and checking after the expiration of a prescribed time frame beginning with the establishment of a valid Reset signal, the control means to see that the signal of the first output signal carrying means returns to an arbitrary valid signal different from the Reset signal, wherein the method is repeated for all other monitoring modules accordingly.

11. A process according to claim 9, wherein the signals fed to the evaluation circuit through the first output signal carrying means and the other output signal carrying means are linked according to the logical AND function in the linking means.

12. A process according to claims 9, wherein the evaluation circuit is encompassed by a diagnosis strategy of an assembly containing the evaluation circuit as a component.

13. A process according to claim 9, wherein the evaluation circuit is encompassed by a process for an integrated self-test of an application-specific integrated circuit containing the evaluation circuit as a component.

14. A process according to claims 9, wherein the at least one monitored physical parameter is made up of an arbitrary selection of physical parameters for which a reset signal is produced in case of a deviation from the prescribed setpoint range.

15. A process according to claim 9, wherein the at least one monitored physical parameter is formed from one of electric voltage, electric current and temperature.

16. A process according to claim 9, wherein the at least one monitored physical parameter is formed from a selection of at least two electric voltages, each of which is monitored by both monitoring modules.

17. A process according to claim 9, wherein signals are output by each of the monitoring modules by a number of output signal carrying means, wherein each of the signals transferred through the numerous output signal carrying means of the same monitoring module has its own time characteristics.

* * * * *